| (12) | United States Patent | (10) Patent No.: | US 6,355,563 B1 |
|---|---|---|---|
| | Cha et al. | (45) Date of Patent: | Mar. 12, 2002 |

(54) VERSATILE COPPER-WIRING LAYOUT DESIGN WITH LOW-K DIELECTRIC INTEGRATION

(75) Inventors: Randall Cher Liang Cha; Alex See; Yeow Kheng Lim, all of Singapore (SG); Tae Jong Lee, Orlando, FL (US); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/798,652

(22) Filed: Mar. 5, 2001

(51) Int. Cl.[7] .............................................. H01L 21/44
(52) U.S. Cl. ..................... 438/687; 438/624; 438/625; 438/626; 438/627; 438/629; 438/631; 438/633; 438/637; 438/638; 438/666; 438/669; 438/672; 438/675
(58) Field of Search ................................. 438/624, 625, 438/626, 627, 629, 631, 633, 637, 638, 666, 669, 672, 675, 687

(56) References Cited

U.S. PATENT DOCUMENTS

| 5,663,108 | A | * | 9/1997 | Lin .............................. 438/624 |
|---|---|---|---|---|
| 5,723,387 | A | | 3/1998 | Chen ........................... 438/692 |
| 5,801,093 | A | * | 9/1998 | Lin .............................. 438/624 |
| 5,811,352 | A | * | 9/1998 | Numata et al. ............. 438/624 |
| 5,861,673 | A | * | 1/1999 | Yoo et al. .................... 257/758 |
| 5,880,018 | A | * | 3/1999 | Boeck et al. ................ 438/619 |
| 5,888,897 | A | * | 3/1999 | Liang .......................... 438/624 |
| 5,930,672 | A | * | 7/1999 | Yamamoto ................... 438/637 |
| 6,001,730 | A | | 12/1999 | Farkas et al. ................ 438/627 |
| 6,010,955 | A | * | 1/2000 | Hashimoto ................... 438/624 |
| 6,030,896 | A | * | 2/2000 | Brown ......................... 438/687 |
| 6,033,963 | A | | 3/2000 | Huang et al. ................ 438/303 |
| 6,033,977 | A | * | 3/2000 | Gutsche et al. ............. 438/637 |
| 6,037,216 | A | * | 3/2000 | Liu et al. ..................... 438/672 |
| 6,117,766 | A | * | 9/2000 | Yoon et al. .................. 438/637 |
| 6,140,238 | A | * | 10/2000 | Kitch .......................... 438/687 |
| 6,143,641 | A | * | 11/2000 | Kitch .......................... 438/687 |
| 6,168,985 | B1 | * | 1/2001 | Asano et al. ................ 438/241 |
| 2001/0005627 | A1 | * | 6/2001 | Matsubara ................... 438/637 |

* cited by examiner

*Primary Examiner*—John F. Niebling
*Assistant Examiner*—Lynne Gurley
(74) *Attorney, Agent, or Firm*—George O. Saile; Rosemary L. S. Pike

(57) ABSTRACT

A method to integrate low dielectric constant dielectric materials with copper metallization is described. A metal line is provided overlying a semiconductor substrate and having a nitride capping layer thereover. A polysilicon layer is deposited over the nitride layer and patterned to form dummy vias. A dielectric liner layer is conformally deposited overlying the nitride layer and dummy vias. A dielectric layer having a low dielectric constant is spun-on overlying the liner layer and covering the dummy vias. The dielectric layer is polished down whereby the dummy vias are exposed. Thereafter, the dielectric layer is cured whereby a cross-linked surface layer is formed. The dummy vias are removed thereby exposing a portion of the nitride layer within the via openings. The exposed nitride layer is removed. The via openings are filled with a copper layer which is planarized to complete copper metallization in the fabrication of an integrated circuit device.

33 Claims, 7 Drawing Sheets

VERSATILE COPPER-WIRING LAYOUT DESIGN WITH LOW-K DIELECTRIC INTEGRATION

BACKGROUND OF THE INVENTION (1) Field of the Invention

The invention relates to a method of metallization in the fabrication of integrated circuits, and more particularly, to a method of integrating low dielectric constant materials with copper metallization in the manufacture of integrated circuits.

(2) Description of the Prior Art

Copper metallization has become a future trend in integrated circuit manufacturing. However, copper contamination of the intermetal dielectric layer is a problem, especially for the desirable low dielectric constant (low-k) materials. Copper mobile ion contamination is fatal and detrimental to low-k dielectric materials. In addition, low-k dielectrics are also fairly susceptible to the harsh effects of plasma ashing as well as plasma etching. It is desired to provide a smooth integration of low-k dielectric materials with copper metallization in order to attain a device of high performance quality.

Co-pending U.S. patent application Ser. No. 09/398,294 (CS-99-024) to L. J. Xun et al, filed on Sept. 20, 1999, teaches using a dielectric layer to protect an underlying low-k dielectric during plasma ashing. U.S. Pat. No. 6,001, 730 to Farkas et al and U.S. Pat. No. 5,723,387 to Chen disclose copper dual damascene processes. U.S. Pat. No. 6,033,963 to Huang et al teaches forming a metal gate using a replacement gate process.

SUMMARY OF THE INVENTION

A principal object of the present invention is to provide an effective and very manufacturable method of copper metallization in the fabrication of integrated circuit devices.

Another object of the present invention is to provide an effective and very manufacturable method of integrating low dielectric constant materials with copper metallization in the fabrication of integrated circuit devices.

Another object of the invention is to prevent copper contamination of the low-k dielectric layer.

Yet another object of the invention is to protect the low-k dielectric layer from damage caused by plasma etching and/or plasma ashing.

A further object of the invention is to effectively integrate low-k dielectrics with copper metallization using a replacement line and replacement via technique.

A still further object of the invention is to prevent copper mobile ion contamination of the low-k dielectric layer with a sidewall liner layer.

Another further object of the invention is to protect the low-k dielectric layer from plasma etch and ashing damage by electron-beam, ion-beam, or X-ray curing.

Yet another object of the invention is to effectively integrate low-k dielectric with copper metallization using replacement line and replacement via techniques which are applicable to single, double, and triple damascene processes.

In accordance with the objects of this invention a new method to integrate low dielectric constant dielectric materials with copper metallization is achieved. A metal line is provided overlying a semiconductor substrate and having a nitride capping layer thereover. A polysilicon layer is deposited over the nitride layer and patterned to form dummy vias. A dielectric liner layer is conformally deposited overlying the nitride layer and dummy vias. A dielectric layer having a low dielectric constant is spun-on overlying the liner layer and covering the dummy vias. The dielectric layer is polished down whereby the dummy vias are exposed. Thereafter, the dielectric layer is cured whereby a cross-linked surface layer is formed. The dummy vias are removed thereby exposing a portion of the nitride layer within the via openings. The exposed nitride layer is removed. The via openings are filled with a copper layer which is planarized to complete copper metallization in the fabrication of an integrated circuit device.

BRIEF DESCRIPTION OF THE DRAWINGS

In the accompanying drawings forming a material part of this description, there is shown:

FIGS. 1 through 12 schematically illustrate in cross-sectional representation a preferred embodiment of the present invention.

DESCRIPTION OF THE PREFERRED EMBODIMENTS

The present invention provides a method for effectively integrating low dielectric constant dielectrics with copper metallization. The low-k materials are protected from copper mobile ions by a sidewall liner layer and are protected from harmful effects of plasma etching and ashing by electron-beam, ion-beam, or X-ray curing. Integration is accomplished using a replacement line and replacement via technique that is applicable to single, double, and triple damascene processes.

Figure 1:
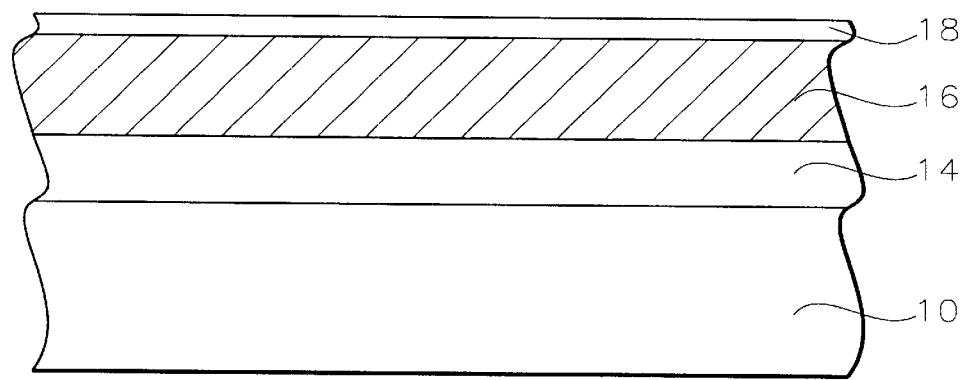

Referring now more particularly to FIG. 1, there is illustrated a portion of a partially completed integrated circuit device. There is shown a semiconductor substrate 10, preferably composed of monocrystalline silicon. An intermetal dielectric (IMD) or interlevel dielectric (ILD) layer 14 is deposited on the substrate wafer. Semiconductor devices structures, such as gate electrodes and source and drain regions, not shown, may be formed in and on the semiconductor substrate and covered by the IMD or ILD layer 14. A copper line 16 is formed over the ILD layer 14 and connects to one or some of the underlying semiconductor device structures, not shown. A thin nitride capping layer 18 is deposited over the copper line to a thickness of between about 300 and 500 Angstroms.

Figure 2:
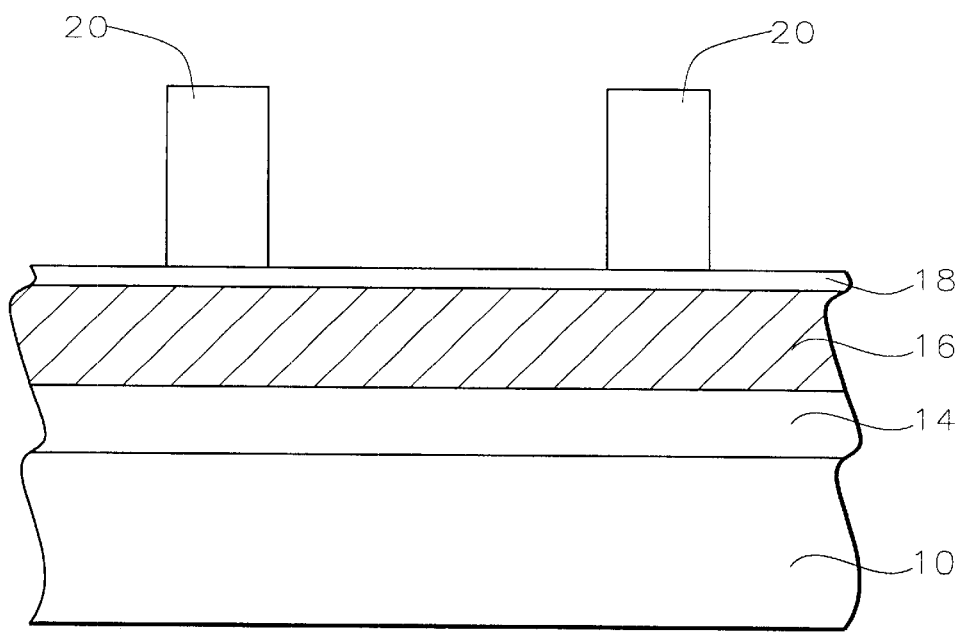

Referring now to FIG. 2, a thick polysilicon layer is deposited over the nitride capping layer. The thickness of the polysilicon layer should be equal to the height of the metal via connection to be formed. The polysilicon layer is etched to form via studs, or dummy vias, 20 where the vias are to be formed.

Figure 3A:
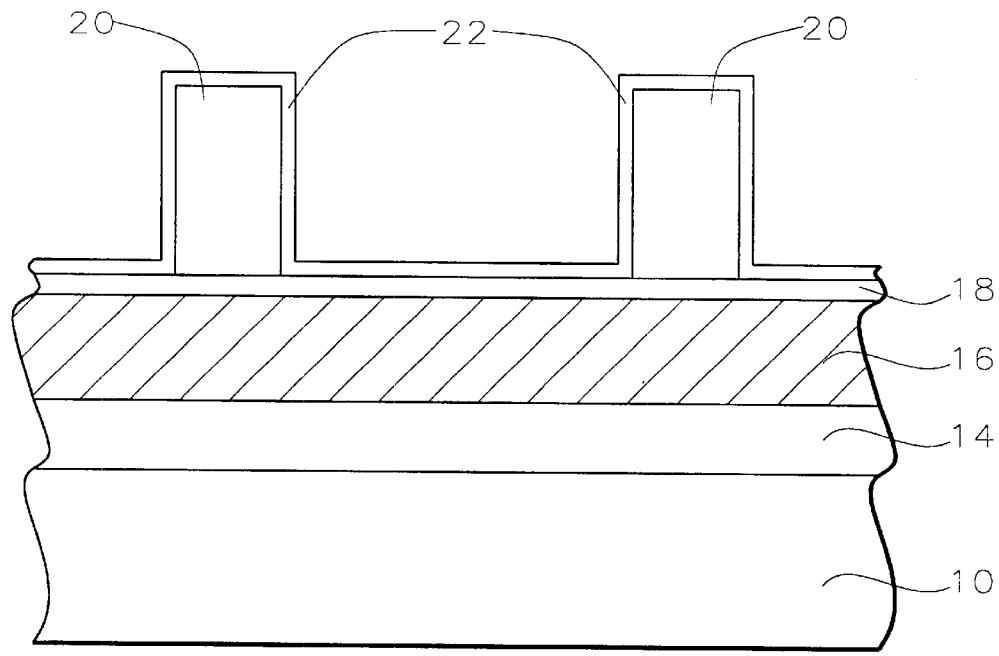
FIGS. 3A and 3B and 9A and 9B illustrate two alternatives for forming the liner layer in the present invention.

Now, a conformal dielectric liner layer 22 is deposited over the nitride layer and the dummy vias 20, as shown in FIG. 3A. The liner layer 22 will provide a sidewall liner for the vias to be formed and will prevent copper mobile ion penetration of the to-be-deposited low-k dielectric layer. The liner layer 22 preferably comprises silicon nitride and is deposited by plasma-enhanced chemical vapor deposition (PE-CVD) to a thickness of between about 300 and 800 Angstroms, depending on future barrier metal thickness.

Figure 3B:
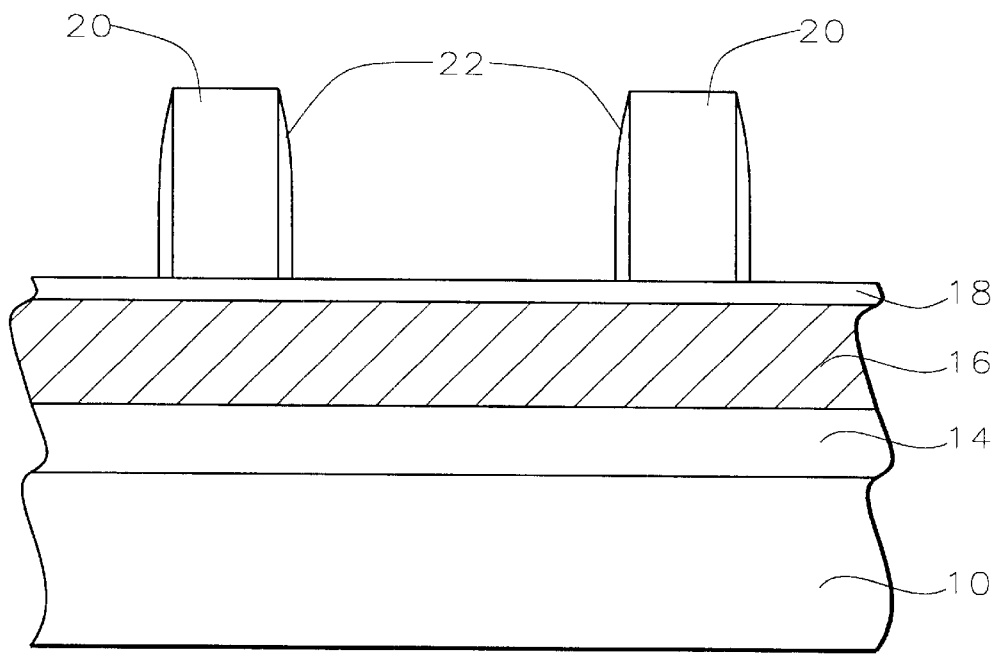

FIG. 3B illustrates an optional step in which a reactive ion etch (RIE) is performed to etch away the liner layer 22 on the horizontal surfaces and leave the liner layer only on the sidewalls of the dummy vias. This will provide some improvement in resistance. It will be understood that processing continues for this option in the same way as shown in the succeeding figures.

The liner layer 22 provides a second protection layer, after the barrier metal layer to be deposited later, to prevent mobile copper ions. Future technologies will see vias becoming ever smaller. It will not be beneficial to deposit a thick barrier metal layer, such as tantalum nitride, into the via hole because that will allow room for little copper fill into the vias, thus causing high via resistance. Therefore, a thin barrier metal layer is attractive, but it will not provide enough protection. Thus, to strengthen the protection of the barrier layer, the non-conducting silicon nitride liner is deposited to increase the "barrier" thickness. The protective property of the barrier metal layer is strengthened by the silicon nitride liner thickness externally. The silicon nitride liner layer provides little contamination to the subsequently deposited low-k dielectric and affords better adhesion.

Figure 4:
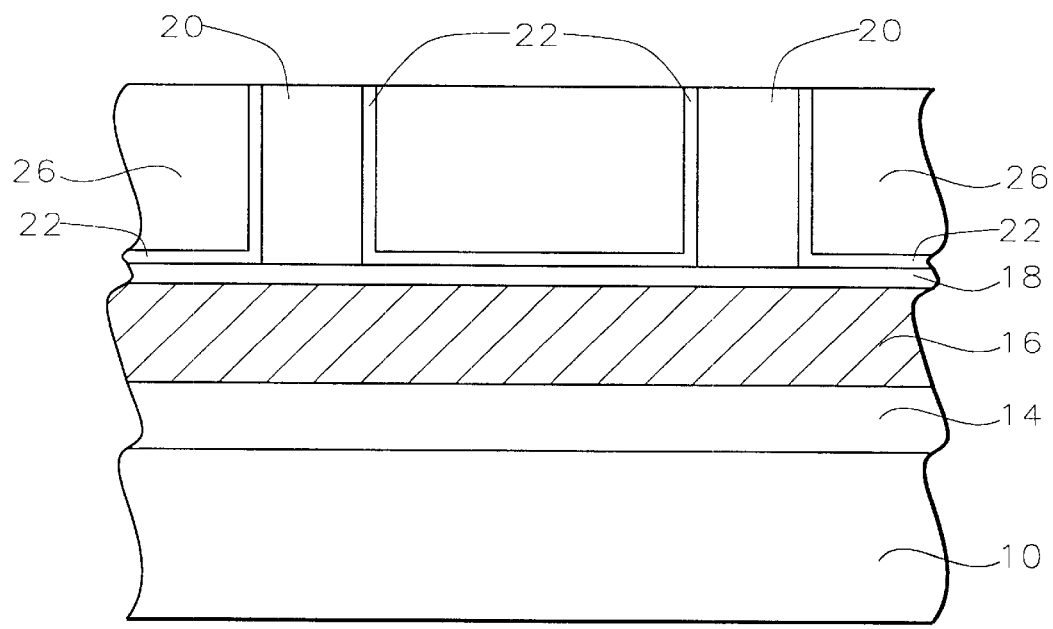

Now, a low-k dielectric layer 26 is spun-on over the liner layer 22 and covering the dummy vias 20. The low-k material may comprise hydrogen silsesquioxane (HSQ), methylsilsesquioxane (MSQ), fluorinated silicate glass (FSG), SILK, FLARE, and so on. The low-k dielectric is polished back using chemical mechanical polishing (CMP) or fixed abrasive pad (FAP) polishing, for example, until the polysilicon of the dummy vias is exposed, as shown in FIG. 4.

Figure 5:
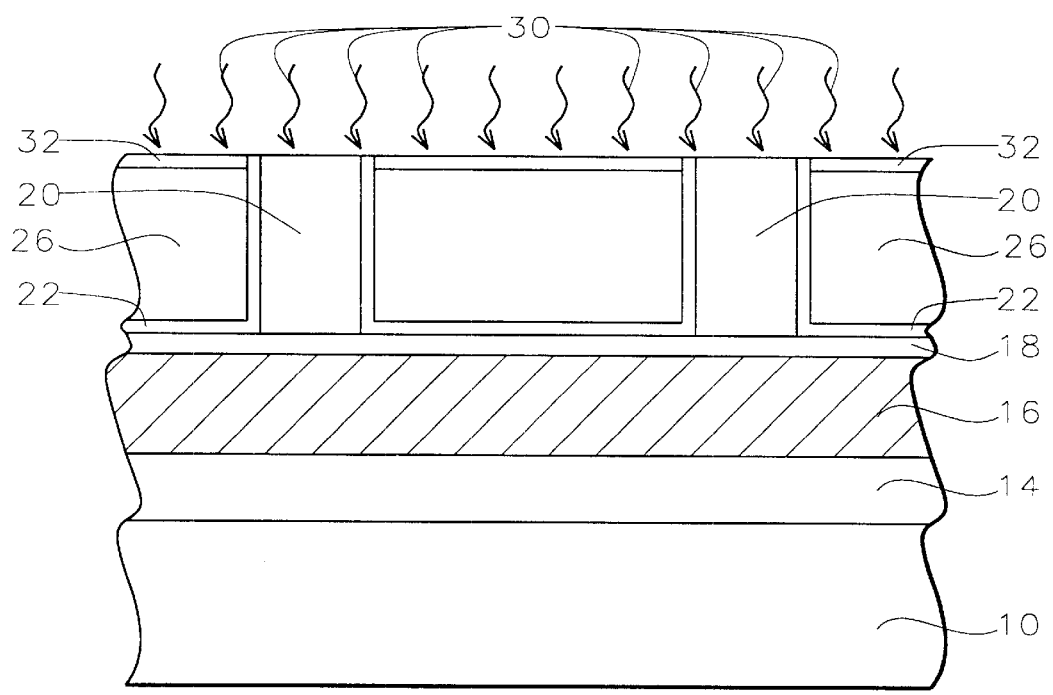

Referring now to FIG. 5, the low-k dielectric surface is exposed to electron-beam, ion-beam, $O_2$ plasma, or X-ray curing 30. The curing alters the low-k dielectric surface properties. That is, the top surface 32 of the dielectric layer is vulcanized or cross-linked to make it mechanically robust and chemically resistant. The strengthening phenomenon is similar to sulfur or rubber vulcanization. However, we can only allow cross-linking or vulcanization at the low-k dielectric surface and not throughout the entire low-k layer so as to preserve the low-k dielectric properties.

Electron-beam curing is preferred. The beam is either rastered across the die as a beam or electron flooding of about a 20×20 field size is performed. The beam intensity may be between about 0.1 to 1 mc/cm². The following table shows examples of electron-beam curing conditions.

| Electron-beam Curing | | | |
| --- | --- | --- | --- |
| Dose (cm$^{-2}$) | Voltage (V) | Current | Temperature (° C.) |
| 1,000 | 3 | 10 | 250 |
| 3,000 | 3 | 10 | 250 |
| 5,000 | 3 | 10 | 250 |
| 5,000 | 3 | 20 | 400 |
| 5,000 | 5 | 20 | 400 |

Now, the exposed polysilicon dummy vias are removed by a wet etch, such as hot concentrated potassium hydroxide (KOH). However, since the low-k dielectric is already protected with a cross-linked surface layer, a remote isotropic plasma dry etch that is selective to remove only polysilicon can also be used. This kind of dry etch technique does not adversely effect the low-k properties.

Figure 6:
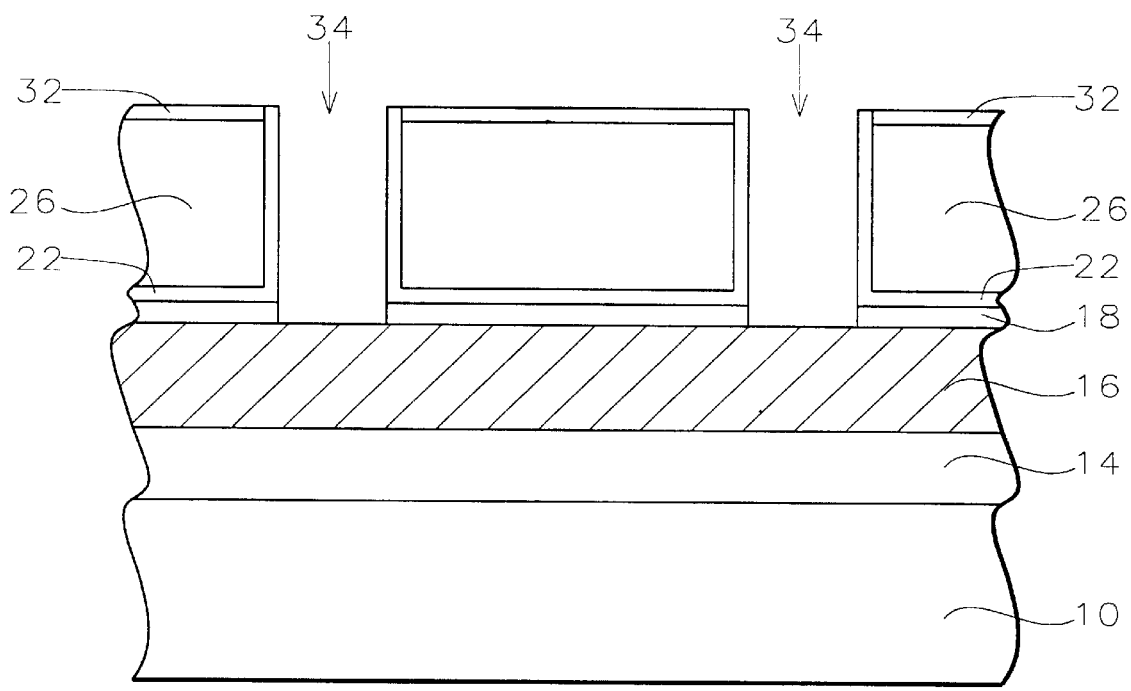

A short self-aligned nitride etch is performed to remove the nitride layer 18 within the via openings 34, as shown in FIG. 6. Alternatively, this step can be incorporated with the Argon pre-sputter cleaning of the via openings. In this alternative, resistance will be reduced and operating frequency will be increased.

Figure 7:
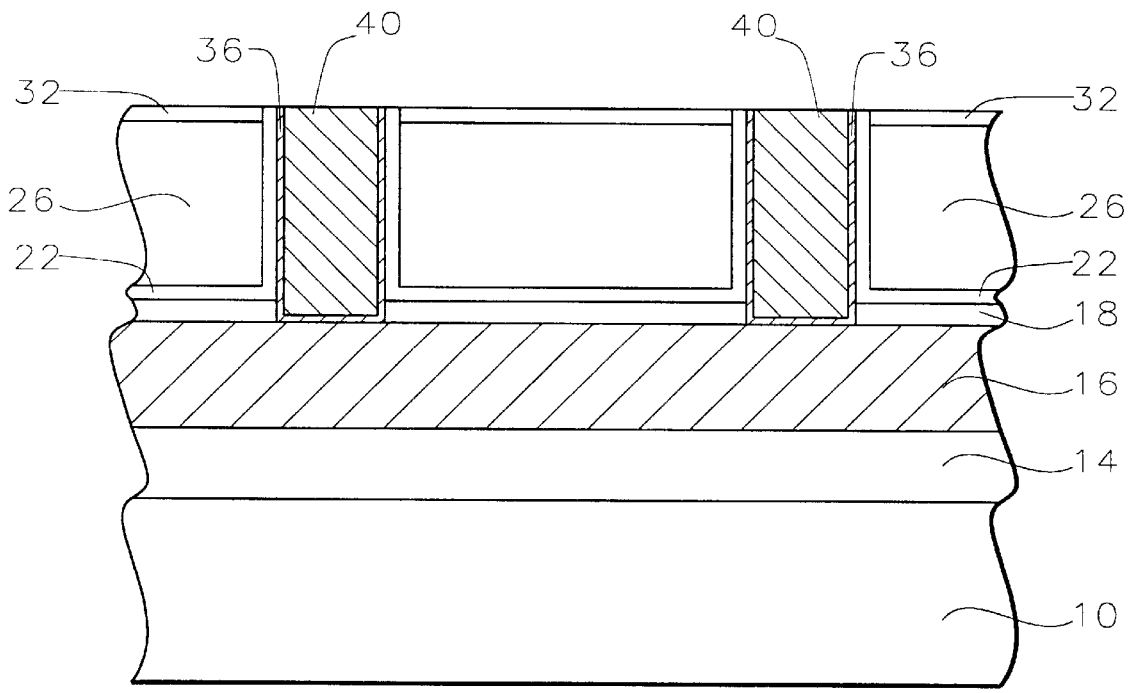

Referring now to FIG. 7, a barrier metal layer 36 is deposited over the cross-linked low-k layer 32 and within the via openings 34. For example, the barrier metal layer may comprise titanium or a titanium compound, tantalum or a tantalum compound, or tungsten or a tungsten compound and may have a thickness of between about 100 and 200 Angstroms for common physical vapor deposition (PVD) techniques such as ionized metal plasma (IMP). For future technologies, we may use atomic layer CVD barrier metal. This barrier metal layer will be thin, but unless proven, will not offer enough protection against copper diffusion. So, the invention's external liner layer of silicon nitride 22 outside the via offers a second protection.

A copper layer 40 is formed over the barrier metal layer 36, by any of the conventional means, including physical or chemical vapor deposition, electrochemical plating (ECP), or electroless plating, and so on. Preferably, a copper seed layer is deposited and copper formed by electroless plating. The copper and barrier metal layers are planarized by CMP or FAP, as shown in FIG. 7. The treated surface 32 of the low-k dielectric and the encapsulating liner layer 22 protect the low-k dielectric layer from copper contamination and deterioration of integrity during the polishing step.

Figure 8:
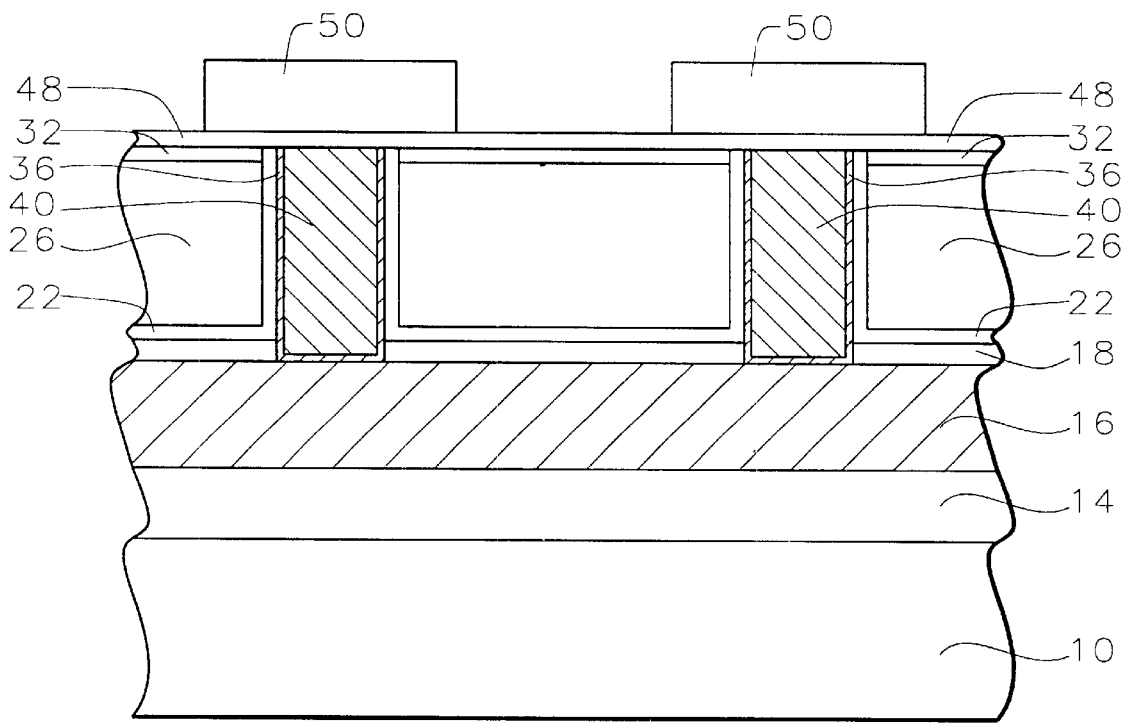

This completes a single damascene structure. If further metallization is to be provided, processing continues. As shown in FIG. 8, another thin nitride layer 48 is deposited over the planarized substrate surface. This layer 40 serves as a capping layer over the copper vias. A second thick polysilicon layer 50 is deposited over the nitride layer to the thickness desired for the metal lines to be formed. The polysilicon layer is patterned to form dummy lines 50.

Figure 9A:
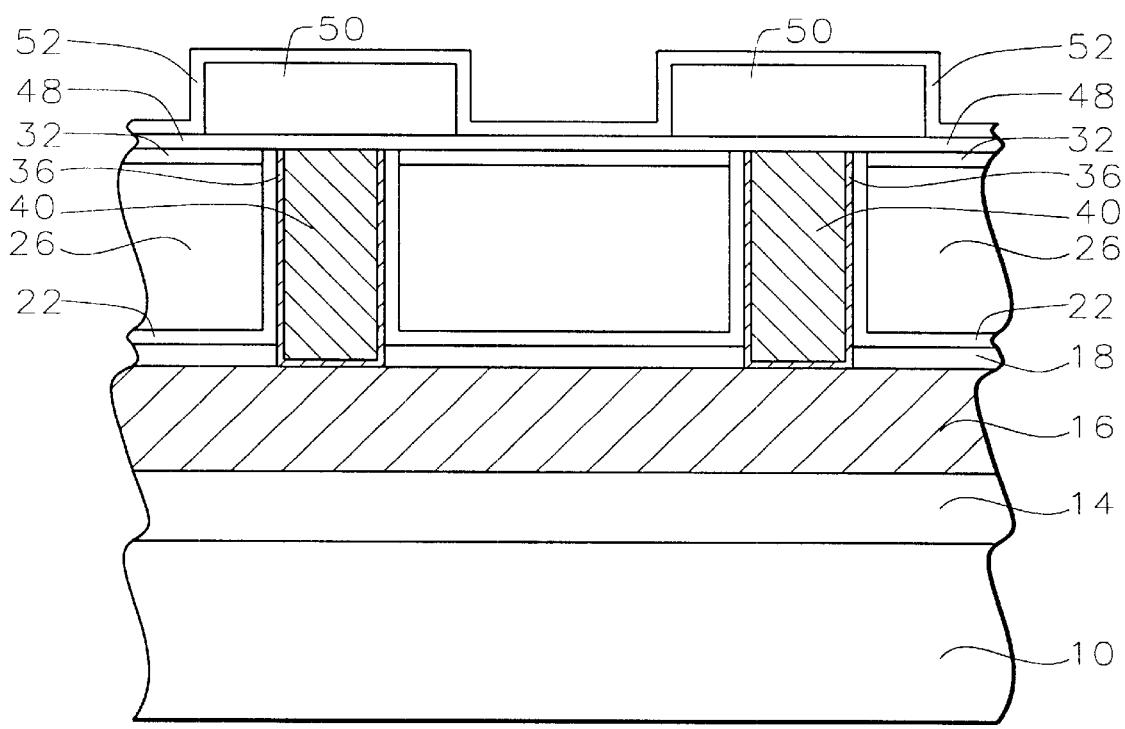

Processing continues similarly to that described previously for forming the metal vias. Referring to FIG. 9A, a conformal dielectric liner layer 52 is deposited over the nitride layer and the dummy lines 50. The liner layer 52 will provide a sidewall liner for the lines to be formed and will prevent copper mobile ion penetration of the to-be-deposited low-k dielectric layer. The liner layer 52 preferably comprises silicon nitride and is deposited by PECVD to a thickness of between about 300 and 800 Angstroms.

Figure 9B:
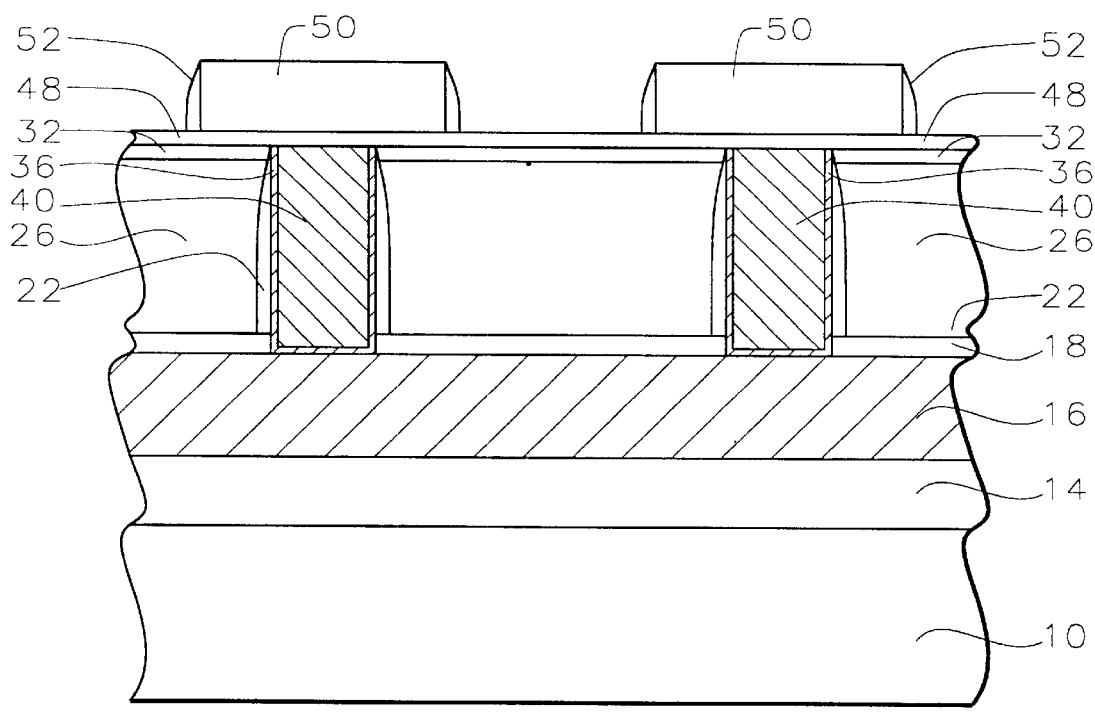

FIG. 9B illustrates the option where the silicon nitride liner layers 22 and 52 have been anisotropically etched by RIE to form spacers on the sidewalls of the vias and lines, respectively. The liner layer provides protection against copper diffusion and so is needed only on the sidewalls of the copper vias and lines. Removing the unnecessary silicon nitride improves RC delay. Processing continues as described for both options.

As described for the first liner layer 22, the second liner layer 52 provides double protection to increase the protective properties of the to-be-deposited barrier metal layer.

Figure 10:
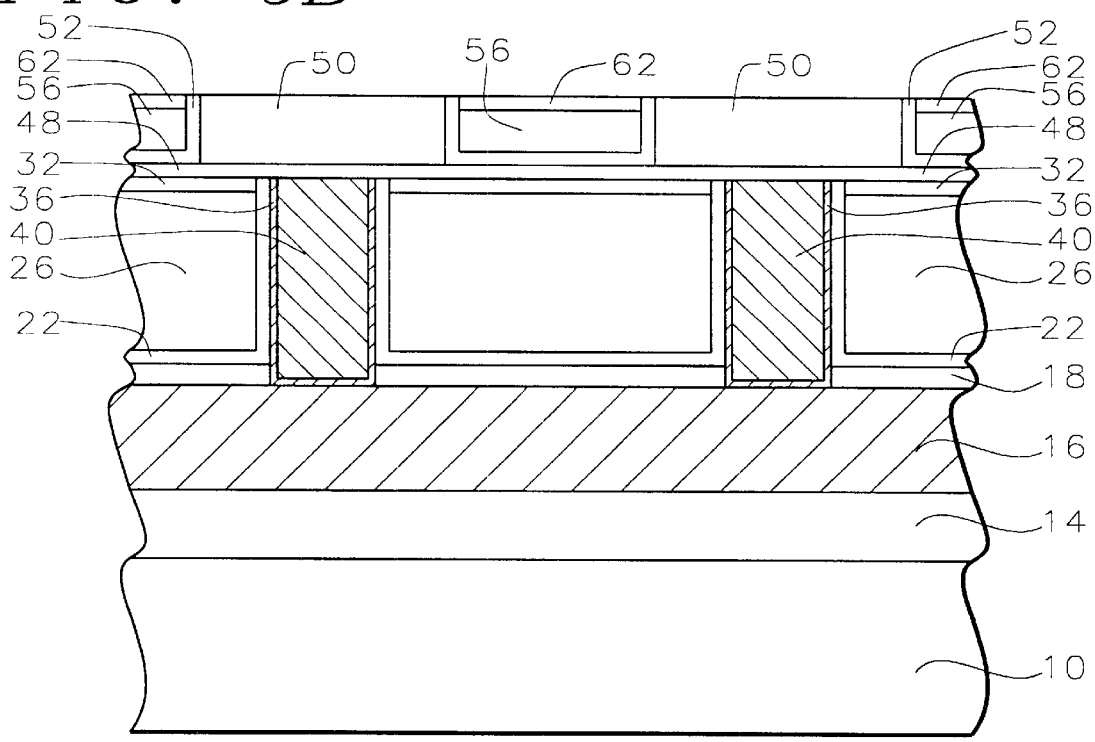

Now, a low-k dielectric layer 56 is spun-on over the liner layer 52 and covering the dummy lines 50. The low-k material may comprise hydrogen silsesquioxane (HSQ), methylsilsesquioxane (MSQ), fluorinated silicate glass (FSG), SILK, FLARE, and so on. The low-k dielectric is polished back using CMP or FAP until the polysilicon of the dummy lines is exposed, as shown in FIG. 10.

The low-k dielectric surface is exposed to electron-beam curing, as described above. The electron-beam curing alters the low-k dielectric surface properties. That is, the top surface 62 of the dielectric layer is vulcanized or cross-linked to make it mechanically robust and chemically resistant. Other forms of curing may be applicable, as noted above. Ion-beam, $O_2$ plasma, or X-ray curing may be used. However, these processes need to be more closely controlled to guard against unintentional damage (physical and radiation).

Figure 11:
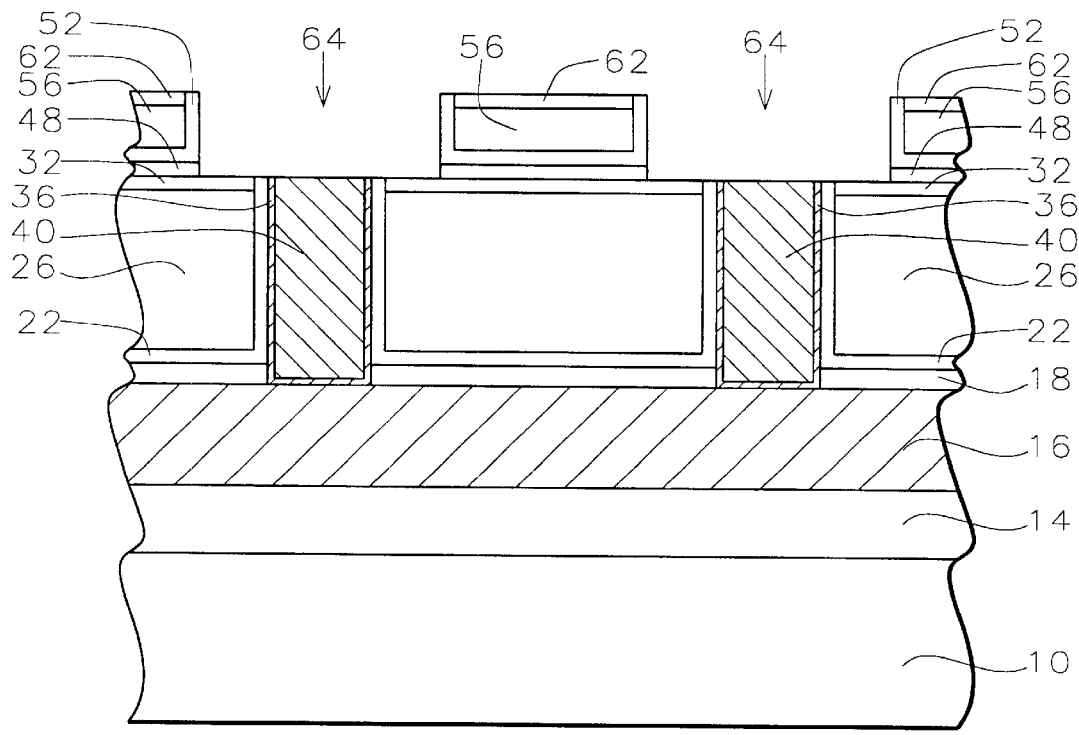

Now, the exposed polysilicon dummy lines are removed by a wet etch, such as concentrated KOH. A short self-aligned nitride etch is performed to remove the nitride layer 48 within the trench openings 64, as illustrated in FIG. 11. Alternatively, this step can be incorporated with the Argon pre-sputter cleaning of the trench openings. In this alternative, resistance will be reduced and operating frequency will be increased.

Figure 12:
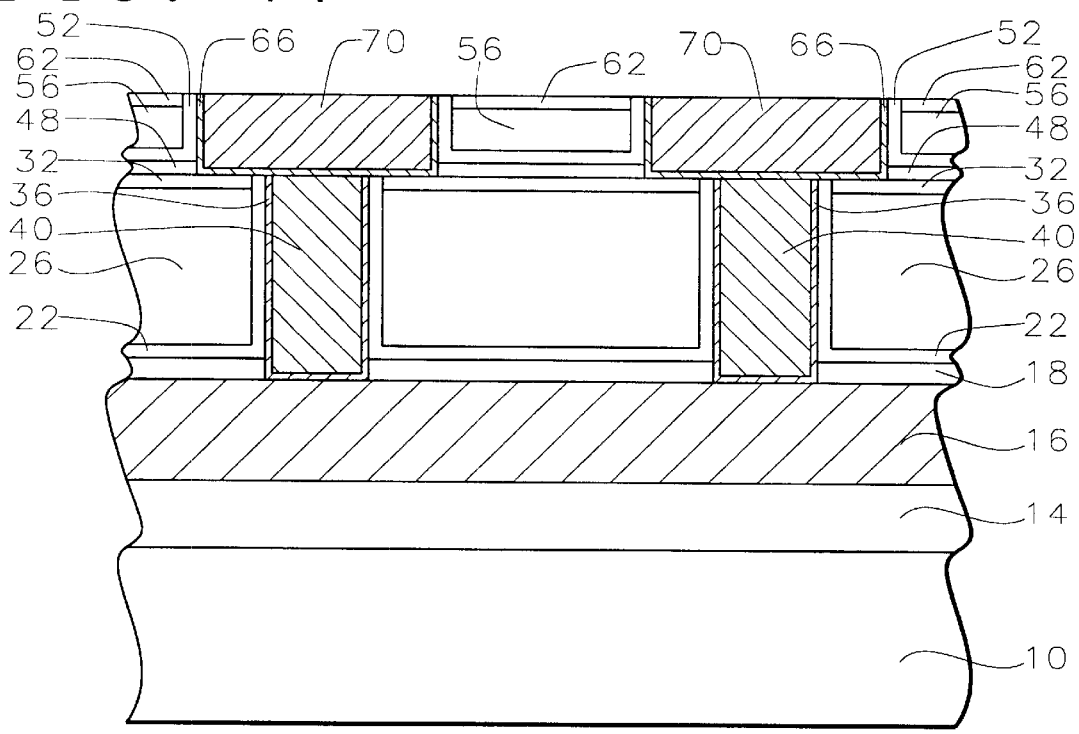

Now, referring to FIG. 12, a barrier metal layer 66 is deposited over the cross-linked low-k layer 62 and within the via openings 64. For example, the barrier metal layer may comprise titanium or a titanium compound, tantalum or a tantalum compound, or tungsten or a tungsten compound and may have a thickness of between about 100 and 200 Angstroms.

A copper layer 70 is formed over the barrier metal layer 66, by any of the conventional means, including physical or chemical vapor deposition, electrochemical plating (ECP), or electroless plating, and so on. Preferably, a copper seed layer us deposited and copper formed by electroless plating. The copper and barrier metal layer are planarized by CMP or FAP, as shown in FIG. 12. The treated surface 62 of the low-k dielectric and the encapsulating liner layer 52 protect the low-k dielectric layer from copper contamination and deterioration of integrity during polishing.

This completes a double damascene structure. If further metallization is to be provided, processing continues, again using the process of the present invention.

The process of the present invention provides a method for effectively integrating low dielectric constant dielectrics with copper metallization. The low-k materials are protected from copper mobile ions by a sidewall dielectric liner layer and are protected from harmful effects of plasma etching and ashing by electron-beam curing, or other forms of curing such as ion-beam or X-ray curing. Integration is accomplished using a replacement line and replacement via technique that is applicable to single, double, and triple damascene processes.

While the invention has been particularly shown and described with reference to the preferred embodiments thereof, it will be understood by those skilled in the art that various changes in form and details may be made without departing from the spirit and scope of the invention.

What is claimed is:

1. A method of copper metallization in the fabrication of an integrated circuit device comprising:

providing a metal line overlying a semiconductor substrate and having a nitride capping layer thereover;

depositing a polysilicon layer over said nitride layer and patterning said polysilicon layer to form dummy vias;

conformally depositing a dielectric liner layer overlying said nitride layer and said dummy vias;

spinning-on a dielectric layer having a low dielectric constant overlying said dielectric liner layer and covering said dummy vias;

polishing down said dielectric layer whereby said dummy vias are exposed;

thereafter curing said dielectric layer whereby a cross-linked surface layer is formed in said dielectric layer;

removing said dummy vias thereby exposing a portion of said nitride layer within via openings;

thereafter removing said nitride layer exposed within said via openings; and filling said via openings with a copper layer and planarizing said copper layer to complete said copper metallization in said fabrication of said integrated circuit device.

2. The method according to claim 1 wherein said metal line comprises copper and wherein said nitride capping layer ha s a thickness of between about 300 and 500 Angstroms.

3. The method according to claim 1 wherein said metal line contacts underlying semiconductor device structures formed in and on said semiconductor substrate.

4. The method according to claim 1 wherein said polysilicon layer is deposited to a thickness equal to that of desired said copper metallization.

5. The method according to claim 1 wherein said dielectric liner layer comprises silicon nitride and has a thickness of between about 300 and 800 Angstroms.

6. The method according to claim 1 wherein said liner layer prevents copper mobile ions from penetrating said dielectric layer.

7. The method according to claim 1 wherein said dielectric layer is selected from the group consisting of: hydrogen silsesquioxane (HSQ), methylsilsesquioxane (MSQ), fluorinated silicate glass (FSG), SILK, and FLARE.

8. The method according to claim 1 wherein said step of polishing down said dielectric layer comprises chemical mechanical polishing or fixed abrasive pad polishing.

9. The method according to claim 1 wherein said curing step comprises one of the group consisting of: electron beam curing, ion-beam curing, $O_2$ plasma curing, and X-ray curing.

10. The method according to claim 1 wherein said cross-linked surface area protects said underlying dielectric layer from damage caused by said removing steps.

11. The method according to claim 1 wherein said step of removing said nitride layer exposed within said via openings is accomplished by a pre-clean argon sputtering step.

12. The method according to claim 1 further comprising:

depositing a barrier metal layer underlying said copper layer; and depositing said copper layer by one of the group consisting of: chemical vapor deposition, physical vapor deposition, electroless plating, and electrochemical plating.

13. A method of copper metallization in the fabrication of an integrated circuit device comprising:

providing a metal line overlying a semiconductor substrate and having a first nitride capping layer thereover;

depositing a first polysilicon layer over said first nitride layer and patterning said first polysilicon layer to form dummy vias;

conformally depositing a first dielectric liner layer overlying said first nitride layer and said dummy vias;

spinning-on a first dielectric layer having a low dielectric constant overlying said first dielectric liner layer and covering said dummy vias;

polishing down said first dielectric layer whereby said dummy vias are exposed;

thereafter curing said first dielectric layer whereby a first cross-linked surface layer is formed in said first dielectric layer;

removing said dummy vias thereby exposing a portion of said first nitride layer within via openings;

thereafter removing said first nitride layer exposed within said via openings;

filling said via openings with a first copper layer and planarizing said first copper layer to form copper vias;

depositing a second nitride capping layer overlying said copper vias and said first cross-linked surface layer;

depositing a second polysilicon layer over said second nitride layer and patterning said second polysilicon layer to form dummy lines;

conformally depositing a second dielectric liner layer overlying said second nitride layer and said dummy lines;

spinning-on a second dielectric layer having a low dielectric constant overlying said second dielectric liner layer and covering said dummy lines;

polishing down said second dielectric layer whereby said dummy lines are exposed;

there after curing said second dielectric layer whereby a second cross-linked surface layer is formed in said second dielectric layer;

removing said dummy lines thereby exposing a portion of said second nitride layer within trench openings;

thereafter removing said second nitride layer exposed with in said trench openings;

filling said trench openings with a second copper layer and planarizing said second copper layer to complete said copper metallization in said fabrication of said integrated circuit device.

14. The method according to claim 13 wherein said metal line comprises copper and wherein said first nitride capping layer has a thickness of between about 300 and 500 Angstroms.

15. The method according to claim 13 wherein said metal line contacts underlying semiconductor device structures formed in and on said semiconductor substrate.

16. The method according to claim 13 wherein said first polysilicon layer is deposited to a thickness equal to that of desired said copper vias.

17. The method according to claim 13 wherein said second polysilicon layer is deposited to a thickness equal to that of desired said copper lines.

18. The method according to claim 13 wherein said first and second dielectric liner layers comprise silicon nitride and have a thickness of between about 300 and 800 Angstroms.

19. The method according to claim 13 wherein said first and second dielectric liner layers prevent copper mobile ions from penetrating said first and second dielectric layers.

20. The method according to claim 13 wherein said first and second dielectric layer material is s elected from the group consisting of: hydrogen silsesquioxane (HSQ), methylsilsesquioxane (MSQ), fluorinated silicate glass (FSG), SILK, and FLARE.

21. The method according to claim 13 wherein said steps of polishing down said first and second dielectric layers comprise chemical mechanical polishing or fixed abrasive pad polishing.

22. The method according to claim 13 wherein said curing steps comprise one of the group consisting of: electron beam curing, ion-beam curing, $O_2$ plasma curing, and X-ray curing.

23. The method according to claim 13 wherein said first and second cross-linked surface areas protect said underlying first and second dielectric layers from damage caused by said removing steps.

24. The method according to claim 13 wherein said steps of removing said first nitride layer exposed within said via openings and said second nitride layer exposed within said trench openings are accomplished by pre-clean argon sputtering steps.

25. The method according to claim 13 further comprising:

depositing a first barrier metal layer underlying said first copper layer; and depositing said first copper layer by one of the group consisting of: chemical vapor deposition, physical vapor deposition, electroless plating, and electrochemical plating.

26. The method according to claim 13 further comprising:

depositing a second barrier metal layer underlying said second copper layer; and depositing said second copper layer by one of the group consisting of: chemical vapor deposition, physical vapor deposition, electroless plating, and electrochemical plating.

27. A method of copper metallization in the fabrication of an integrated circuit device comprising:

providing a metal line overlying a semiconductor substrate and having a nitride capping layer thereover;

depositing a polysilicon layer over said nitride layer and patterning said polysilicon layer to form dummy vias;

conformally depositing a dielectric liner layer overlying said nitride layer and said dummy vias;

spinning-on a dielectric layer having a low dielectric constant overlying said dielectric liner layer and covering said dummy vias;

polishing down said dielectric layer whereby said dummy vias are exposed;

thereafter electron-beam curing said dielectric layer whereby a cross-linked surface layer is formed in said dielectric layer;

removing said dummy vias thereby exposing a portion of said nitride layer within via openings;

thereafter removing said nitride layer exposed within said via openings wherein said cross-linked surface layer protects said dielectric area from damage during said removing steps;

depositing a barrier metal layer overlying said cross-linked surface area and within said via openings; and filling said via openings with a copper layer and planarizing said copper layer and said barrier metal layer wherein said liner layer prevents copper mobile ions from penetrating said dielectric layer to complete said copper metallization in said fabrication of said integrated circuit device.

28. The method according to claim 27 wherein said metal line comprises copper and wherein said nitride capping layer has a thickness of between about 300 and 500 Angstroms.

29. The method according to claim 27 wherein said polysilicon layer is deposited to a thickness equal to that of desired said copper metallization.

30. The method according to claim 27 wherein said dielectric liner layer comprises silicon nitride and has a thickness of between about 300 and 800 Angstroms.

31. The method according to claim 27 wherein said dielectric layer is selected from the group consisting of: hydrogen silsesquioxane (HSQ), methylsilsesquioxane (MSQ), fluorinated silicate glass (FSG), SILK, and FLARE.

32. The method according to claim 27 wherein said step of removing said nitride layer exposed within said via openings is accomplished by a pre-clean argon sputtering step.

33. The method according to claim 27 further comprising forming higher levels of metallization overlying said copper vias.

* * * * *